United States Patent [19]

Umeda et al.

[11] Patent Number: 5,001,382
[45] Date of Patent: Mar. 19, 1991

[54] STEPPING MOTOR AND A METHOD OF DRIVING THE SAME

[75] Inventors: Mikio Umeda; Kazumasa Ohnishi, both of Nagaoka; Minoru Kurosawa, Yokohama, all of Japan

[73] Assignee: Alps Electric Co., Ltd., Tokyo, Japan

[21] Appl. No.: 404,373

[22] Filed: Sep. 7, 1989

[30] Foreign Application Priority Data

Nov. 28, 1988 [JP] Japan ................................. 63-300175
Dec. 28, 1988 [JP] Japan ................................. 63-300176
Apr. 26, 1989 [JP] Japan ................................. 1-106929

[51] Int. Cl.⁵ ............................................. H01L 41/08
[52] U.S. Cl. .................................... 310/328; 310/323; 310/325
[58] Field of Search .............. 310/328, 333, 323, 49 R

[56] References Cited

U.S. PATENT DOCUMENTS 4,562,374 12/1985 Sashida ................................. 310/328
4,885,499 12/1989 Ueha et al. ........................... 310/328

Primary Examiner—Mark O. Budd
Attorney, Agent, or Firm—Guy W. Shoup; Paul J. Winters

[57] ABSTRACT

According to the invention, there is provided a stepping motor comprising a laminate type torsion actuator having a pair of cylindrical outer peripheries to be torsionally displaced relative to each other, a cylindrical fixed member surrounding said laminate type torsion actuator with certain space therebetween, first longitudinally vibrating elements placed between said fixed member and one of the cylindrical outer peripheries of said laminate type torsion actuator for selectively connecting or separating the fixed member and the torsion actuator through its elongation or contraction, second longitudinally vibrating elements placed between said fixed member and the other cylindrical peripheries of said torsion actuator with certain space therebetween for selectively connecting or separating the fixed member and the torsion actuator through its elongation or contraction with a phase inverse to that of the first elements. Such a stepping motor allows fine control of its rotary speed and position and large torque.

6 Claims, 11 Drawing Sheets

STEPPING MOTOR AND A METHOD OF DRIVING THE SAME

BACKGROUND OF THE INVENTION

1. Field of the Invention

This invention relates to a stepping motor utilizing the thickness slide effect of a piezoelectric material to generate rotary force of the motor and a method of driving such a stepping motor.

2. Prior Art

There has been known an ultrasonic motor comprising a piezoelectric device that utilizes the piezoelectric effect of deforming a dielectric body such as ceramic by applying voltage to it. FIG. 17 of the accompanying drawings illustrates such a known ultrasonic motor comprising a torsional vibrator 103, which is principally constituted by a piezoelectric device 101 and a coupler 102. As shown in FIG. 17, the main component of the coupler 102 is a disc-shaped member 107 having an indented edge portion 106 that comes into engagement with a matching protruding edge portion 105 of a resonator 104 placed contiguous to the piezoelectric device 101 and a projection 108 provided on the side opposite to the indented edge portion 106 in such a manner that they are positioned askance to each other so that the projection 108 is twisted as motive power when the disc-shaped member 107 is deflected by axial elongation or contraction of the resonant 104. When such a torsion vibrator is rigidly fitted to a rotor 109 as illustrated in FIG. 17, the rotor 109 will be allowed to rotate only in one direction.

PROBLEMS TO BE SOLVED BY THE INVENTION

Since an ultrasonic motor as described above is so designed as to convert elongation or contraction of the resonator 104 into deflection of the coupler 102, it is operable only when it is in a resonant condition. Therefore, while such a motor allows a large displacement in itself that leads to generation of relatlively large rotary force, it is not suitable to be used as a stepping motor that requires fine control of small rotary displacement of the motor.

It is therefore an object of the present invention to provide a stepping motor that allows fine control of rotary displacement and rotary speed by varying the voltage and/or the frequency of the source power which is supplied to it.

SUMMARY OF THE INVENTION

The above and other objects of the invention is achieved by providing a stepping motor comprising a laminate type torsion actuator having a pair of cylindrical outer peripheries that can be displaced by torsion relative to each other, a cylindrical fixed member that surrounds said laminate type torsion actuator with a predetermined space therebetween, a first longitudinal vibrator located between said fixed member and one of said cylindrical outer peripheries of said laminate type torsion actuator and designed to move said laminate type torsion actuator close to or away from fixed member as it contracts or expands, a second longitudinal vibrator located between said fixed member and the other of said cylindrical outer peripheries of said laminate type torsion actuator and desinged to conversely move said laminate type torsion actuator away from or close to said fixed member through its own expansion or contraction with a phase opposite to that of expansion or contraction of the first longitudinal vibrator. Preferably either one or both of said first and second longitudinal vibrators are realized in a cylindrical form.

A preferable embodiment of the invention comprises a laminate type torsion actuator, a facing member juxtaposed with said actuator, said actuator and said facing member being relatively rotatable, and a longitudinally displacing element located between the surface of an axial end portion of said torsion actuator and said facing member for moving said facing member close to or away from said torsion actuator through its expansion or contraction. Such a laminate type torsion actuator may be formed by arranging a number of piezoelectric elements in a plane in such a manner that their poles are directed along tangents of coaxial circles and a pair of plate electrodes on the laterial sides of each of the piezoelectric elements to form a torsion device and by laminating a number of such torsion devices. The effect of sliding deformation of the piezoelectric elements within the plane containing the poles may be utilized by placing the torsion actuator in an electric field directed perpendicular to the direction of the poles of the piezoelectric elements.

A stepping motor according to the invention preferably comprises a laminate type torsion actuator, a facing member juxtaposed with said actuator, said torsion actuator and said facing member being rotatable relative to each other, a first longtudinal vibrator located between said laminate type torsion actuator and said facing member for moving said facing member close to or away from said torsion actuator through its contraction or expansion and a second longitudinal vibrator provided between said facing member and a fixed member juxtaposed with said facing member for moving said facing member close to or away from said fixed member through its oscillation with a phase opposite to that of oscillation of said first longitudinal vibrator. Preferably one or both of said first and second longitudinal vibrators are realized in a cylindrical form. Besides, said laminate type torsion actuator and said facing member are preferably connected together by means of a connector for controlling the distance between the actuator and the facing member but nevertheless rotatable relative to each other. Said fixed member is preferably constituted by a second laminate type torsion actuator that oscillates with a phase opposite to that of oscillation of said laminate type torsion actuator.

The present invention provides a method of driving a stepping motor comprising a laminate type torsion actuator, a facing member juxtaposed with said actuator, said torsion actuator and said facing member being rotatable relative to each other, a first longitudinal vibrator located between said laminate type torsion actuator and said facing member for moving said facing member close to or away from said torsion actuator through its contraction or expansion and a second longitudinal vibrator provided between said facing member and a fixed member juxtaposed with said facing member for moving said facing member close to or away from said fixed member through its oscillation with a phase opposite to that of oscillation of said first longitudinal vibrator, characterized by that said laminate type torsion actuator and said first longitudinal vibrator are oscillated with a frequency equal to the resonance frequency of said laminate type torsion actuator and that at the same time said second longitudinal vibrator is held in a halted condition or in a condition where said laminate type torsion actuator and said facing member are separated from each other.

Said laminate type torsion actuator is formed by arranging a number of piezoelectric elements in such a manner that their poles are directed along tangents of coaxial circles and a pair of plate electrodes on the lateral sides of each of the piezoelectric elements to form a torsion device and by laminating a number of such torsion devices so that the so-called thickness slide effect of slide deformation of the piezoelectric elements within the plane containing the poles may be utilized by placing the torsion actuator in an electric field directed perpendicular to the direction of the poles of the piezoelectric elements.

EFFECTS

With a piezoelectric motor having a configuration as described above, the torsion elements are twisted and deformed when voltage is applied to the laminate type torsion actuator. When DC is supplied to the motor the torsion actuator is twisted by a certain angle to come to a balanced condition. The magnitude of the twisted angle is proportional to that of the applied voltage. To the contrary, when AC is applied, the torsion elements are oscillated, the amplitude of oscillation being proportional to the magnitude of the applied voltage and the frequency is proportional to the frequency of the supplied AC. Hence the rate of rotation is proportional to the product of the voltage and the frequency of the supplied electricity. The oscillation is transmitted to the fixed member by way of the longitudinal vibration type piezoelectric elements and, when the longitudinal vibration type piezoelectric elements are expanded and contracted with a frequency equal to that of the laminate type torsion actuator, the rotation of the laminate type torsion actuator is transmitted to the fixed member only in one direction such that the laminate type torsion actuator is rotated by the reaction of the rotation. Then the rotation of the actuator is utilized as rotary force such that step by step rotation is available, the rate of rotation being proportional to the product of the voltage and the frequency of the power source.

In a stepping motor having a facing member arranged in the vicinity of a laminate type torsion actuator, the oscillation of the laminate type torsion actuator is transmitted to the facing member by way of longitudinal vibration type piezoelectric elements. If the longitudinal vibration type piezoelectric elements are expanded and contracted with a frequency which is equal to that of the laminate type torsion actuator, the rotation of the laminate type torsion actuator is transmitted to the facing member only in one direction such that the rotation of the facing member can be utilized as rotary output of the motor, allowing step by step rotation whose rate of rotation is proportional to the product of the voltage and the frequency of the power source.

When voltage is applied to the laminate type torsion actuator, the torsion elements are twisted and deformed. If DC voltage is applied, the elements will reach a balanced condition where they are twisted by a certain angle. On the contrary, if AC voltage is applied, the torsion elements will be oscillated with an amplitude proportional to the applied voltage and a frequency corresponding to the frequency of the power source. The oscillation is transmitted to the facing member by way of the longitudinal displacement elements. If the longitudinal displacement elements are expanded and contracted with a frequency equal to that of the torsion actuator, the rotation of the torsion actuator is transmitted to the facing member only in one direction such that the rotation of the facing member can be utilized as the output of the motor. The rate of rotation of the motor is proportional to the product of the voltage and the frequency of the power source.

If the laminate type torsion actuator of a stepping motor according to the present invention is used in a resonant condition, the torsion vibration of the laminate type torsion actuator is added to the longitudinal vibration of the first longitudinal vibrator to produce elliptical progressive waves such that the stepping motor can be driven for continuous high speed rotation.

Now the present invention will be described in greater detail by referring to the accompanying drawings which illustrate preferred embodiments of the invention.

DETAILED DESCRIPTION OF THE INVENTION

Now a first embodiment of the invention will be described by referring to FIGS. 1 through 6.

Figure 1:
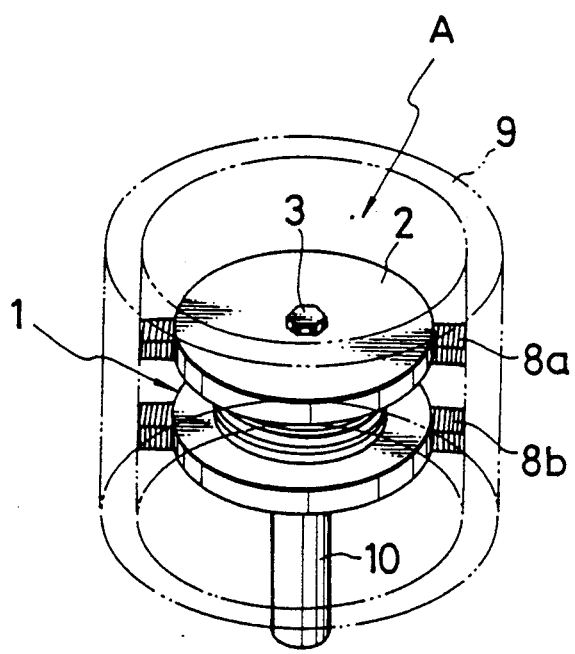
FIG. 1 is a perspective view of a first embodiment of the invention.
Figure 2:
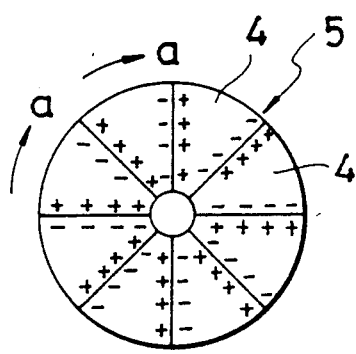
FIG. 2 is a schematic illustration of polarization of piezoelectric elements.
Figure 3:
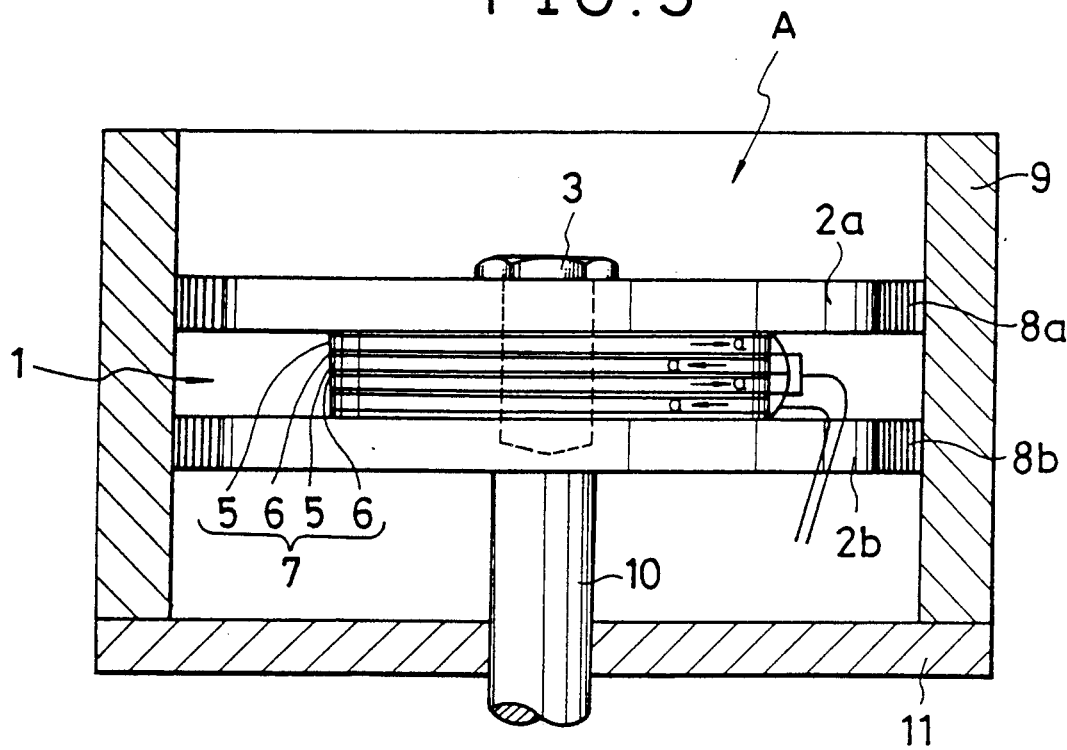
FIG. 3 is a sectional view of the embodiment of FIG. 1.

In FIGS. 1 through 3, reference numeral 1 denotes a laminate piezoelectric member provided with a pair of cylindrical end plates 2a, 2b made of aluminium and located at its both ends. The assembly is fastened together by a fastening bolt 3 that presses the laminate piezoelectric member with a certain pressure.

As illustrated in FIGS. 2 and 3, said laminate piezoelectric member 1 is formed by alternately laminating a number of piezoelectric ceramic layers 5, each of which comprises eight piezoelectric elements, and a same number of electrode plates 6, said piezoelectric ceramic layer 5 having a disc-like form with a central through bore and constituted by eight identical sector-shaped piezoelectric elements. Each of said piezoelectric elements 4 is made of a piezoelectric ceramic material such as PZT and the piezoelectric elements of a layer will be polarized in a same direction along the outer periphery of the disc as shown by arrows a in FIG. 2 when high voltage is applied thereto from the upper and lower surfaces of the disc.

Each of said piezoelectric ceramic layers 5 is sandwiched by a pair of electrode plates 6, 6 and bonded together by means of adhesive, forming a unit torsion element 7. In this embodiment, ceramic layers 5 and electrode plates 6 are arranged alternately such that a total of four torsion devices 7 are formed in so many layers. It should be noted that any two adjacent piezoelectric ceramic layers 5 are polarized in the opposite directions relative to each other and that every other electrode plates 6 are commonly connected with the power source.

A laminate type torsion actuator A as described above is provided with two pairs of longitudinally vibrating piezoelectric elements 8a, 8b radially projecting from the opposite positions on the outer periphery of the end plates 2a, 2b such that they are radially oscillated as they are elongated and contracted when altenating current is supplied. The phase of oscillation of the piezoelectric elements 8a are shifted by 180° from that of the elements 8b such that, when the elements 8a are elongated, the elements 8b are contracted. The frequency of oscillation of the elements 8a, 8b is equal to that of AC supplied from the power source to the laminate type torsion actuator A.

The outer periphery of the laminate type torsion actuator A is surrounded by a cylindrical body (fixed member) 9 having an inner diameter approximately equal to the distance between the outer ends of a pair of said longitudinally vibrating piezoelectric elements 8a. An output shaft 10 is projecting from the center of the end plate 2a in such a manner that said shaft 10 is rotatable but restricted for its axial movement by a bearing (not shown) rigidly fitted to the bottom plate 11 of the cylindrical body 9.

Figure 4:
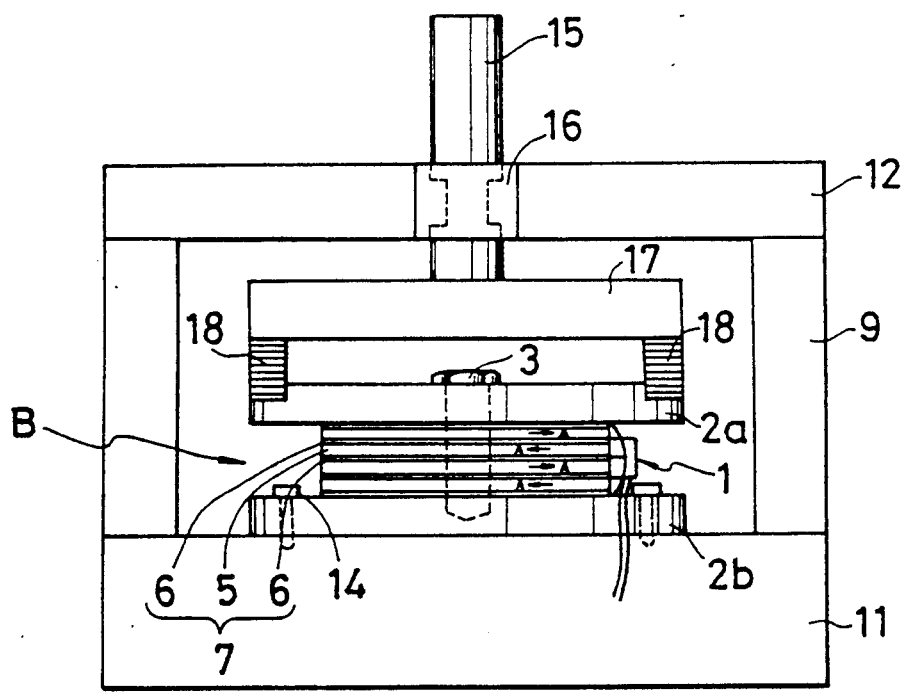
FIGS. 4 and 5 are two different graphic illustrations showing the relationship between the voltage and the displacement of a laminate type torsion actuator.

Now referring to FIG. 4, a torsion actuator B having a configuration as described above is housed in a cylindrical body 13 provided with a bottom plate 11 and a top plate 12 and coaxially and rigidly fitted to the cylindrical body as its end plate 2b and the bottom plate 11 are fastened together by a bolt 14. An output shaft 15 is supported by said top plate 12 and restricted by a bearing 16 for its axial movement. The lower end of the output shaft 15 is connected with a rotor 17, which has a diameter approximately equal to that of the upper end plate 2a of the torsion actuator B. Consequently, the rotor 17 and the upper end plate 2a are juxaposed with each other with a certain distance provided therebetween. A number of laminate type piezoelectric elements 18 that can be longitudinally elongated and contracted (longitudinal displacement elements) are arranged on the upper surface of the upper end plate 2a along the outer periphery thereof with identical spaces provided therebetween. (In FIG. 4, two elements are symmetrically arranged.) The length of the longitudinal displacement elements 18 is approximately equal to the distance between the end plate 2a and the rotor 17 and the elements are so arranged that the end plate 2a and the rotor 17 are separated from each other when the elements 18 are contracted but the end surfaces of the elements 18 push the rotor 17 with a certain pressure when they are elongated. The longitudinal displacement elements 18 are oscillated with a frequency equal to that of the alternating current supplied to the twist elements 7 with a phase which is identical with or shifted by 180° from that of the torsion actuator B. In other words, when the twist actuator B is swung in one direction, the longitudinal displacement elements 18 are in an elongated condition, where the end plate 2a and the rotor 17 are connected together and the vibration of the end plate 2a is transmitted to the rotor 17. On the contrary, when the torsion actuator B is swung in the opposite direction, the longitudinal displacement elements 18 are in a contracted condition, where the vibration of the end plate 2a is not transmitted to the rotor 17.

Figure 5:
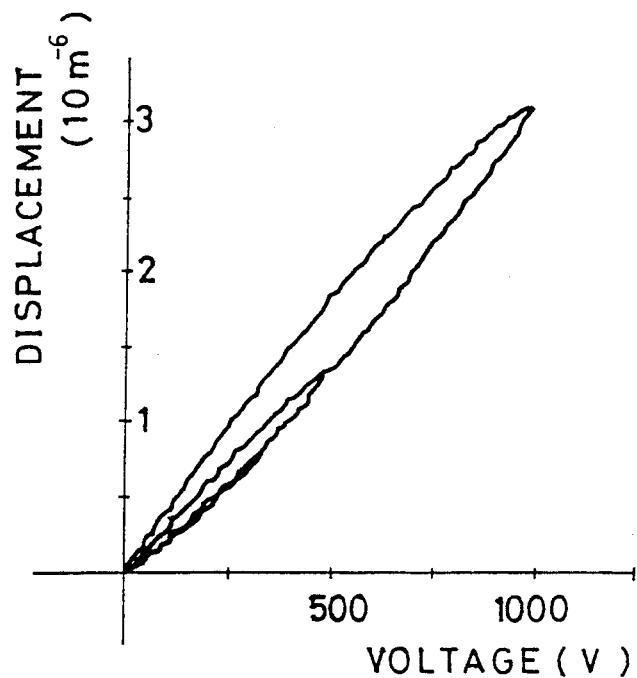
Figure 6:
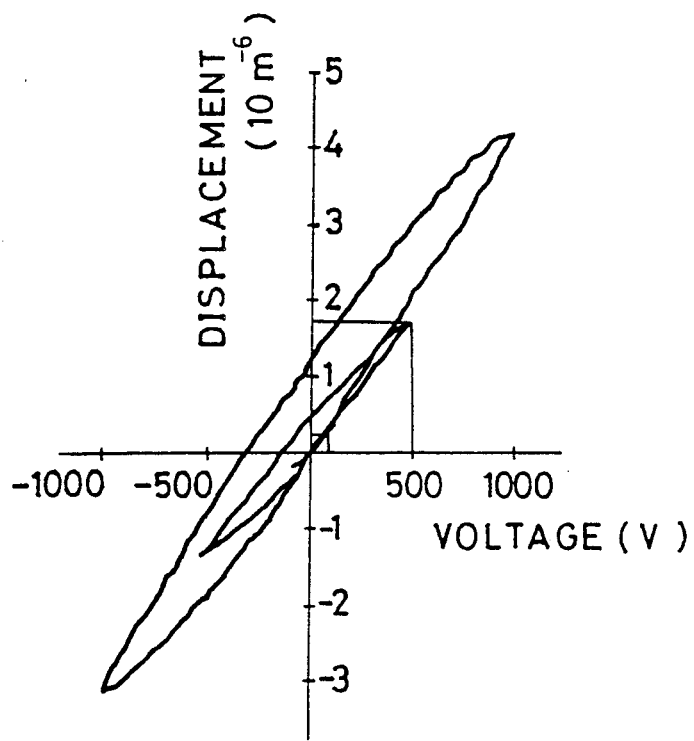
FIG. 6 is a schematic illustration showing the mechanism of rotation of the embodiment of FIG. 1.

In an experiment where aluminium was used for end plates 2a, 2b, PZT for ceramic piezoelectric elements 4 and phosphobronze for electrode plates 6 to reazlize a piezoelectric actuator A comprising piezoelectric ceramic members, each having a thickness of 1.5 mm and a diameter of 40 mm, and a laminate piezoelectric body 1 having a thickness of 7.5 mm and provided with a pair of end plates having a thickness of 5 mm and a diameter of 60 mm, the displacement of the piezoelectric actuator was as illustrated in FIG. 5 when the applied voltage was varied within the range of 0–500 V and of 0–1,000 V and as illustrated in FIG. 6 when the applied voltage was varied from −500 V to +500 V and from −1,000 to +1,000 V. Table 1 shows the torsion angle between the two end plates 2a and 2b and the rate of angular torsion of any one of the twist elements 7 calculated from the displacement of FIGS. 5 and 6.

As seen from the charts, the value of displacement varies in proportion with the value of the power source voltage, although it exhibits a certain hysterisis. The displacement is extremely small relative to the variation of voltage.

TABLE 1

| applied voltage (V) | 500 | 1,000 |
| --- | --- | --- |
| electric field (V/mm) | 333 | 667 |
| displacement (μm) of the observed point | 1.41 | 3.14 |
| angular distorsion of the end plates | $1.97 \times 10^{-3}$ | $4.39 \times 10^{-3}$ |
| rate of angular distorsion of a twist element | $3.28 \times 10^{-4}$ | $7.32 \times 10^{-4}$ |

PZT which was used for the piezoelectric ceramic members has a very large thickness slide constant $d_{15}$ of $460 \times 10^{-12}$ m/V and hence is very flexible. An actuator utilizing such a material can exhibit a large displacement relative to the applied voltage.

A stepping motor having a configuration as described above operates in the following manner.

Figure 7A:
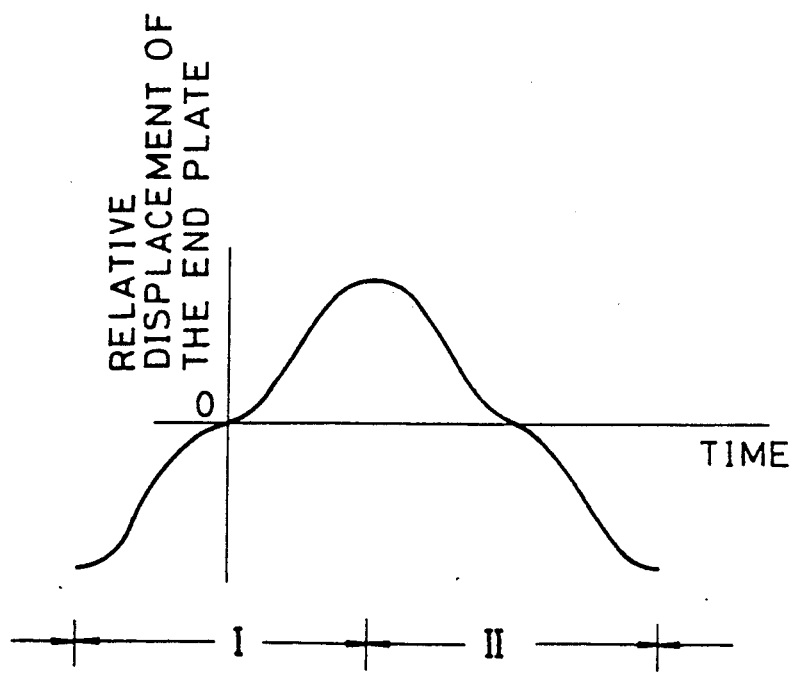
FIG. 7 is a schematic view of a second embodiment of the invention.
Figure 7B:
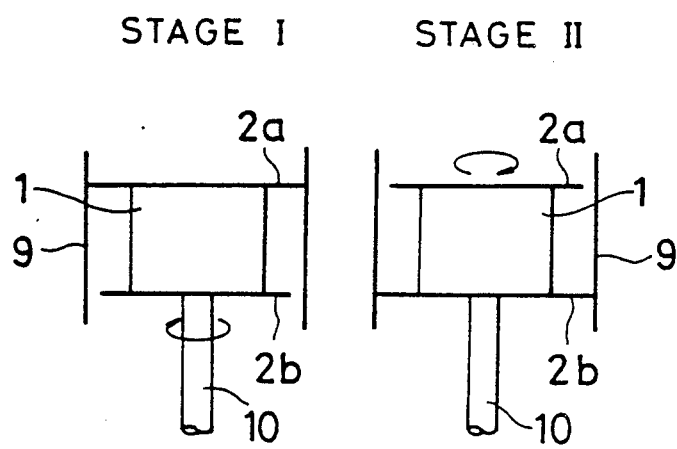

If alternating voltage having an appropriate frequency is applied to the laminate type torsion actuator of such a stepping motor, one of the end plates 2a is torsionally vibrated relative to the other end plate 2b as graphically illustrated in FIG. 7(a). Therefore, when an alternating voltage with a frequency and a phase same as those of the voltage for the laminate type torsion actuator A and an alternating voltage with a frequency same as that of the voltage for the laminate type torsion actuator A but a phase different from it by 180° are respectively applied to the longtudinally vibrating piezoelectric devices 8a and 8b, the end plates 2a and 2b will be alternately clamped to the cylindrical body 9. More specifically, as shown in FIG. 7(b), the upper end plate 2 will be clamped in stage I of FIG. 7(a), during which the the lower end plate 2 and the output shaft 10 rotate. On the other hand, the lower end plate 2 will be clamped in stage II, during which only the upper end plate 2 rotates. Thus, the motor will operate as a stepping motor since the output shaft 10 rotates only in one direction and the amount of rotation is proportional to the pulse applied to the laminate type torsion actuator A and the longtudinally vibrating piezoelectric devices. Thanks to the characteristics of the laminate type torsion actuator of a stepping motor according to the invention, the angle of rotation for each pulse is very small and hence a very large torque is generated. Moreover, since the motor is driven against friction, it will be stopped each time with precision. As the angle of rotation for each pulse is proportional to the voltage of the power source, it can be easily modified by varying the voltage, making the motor particularly suitable as a driving motor for a small electronic equipment.

A second embodiment of the invention is illustrated in FIG. 4, in which components similar to those of the first embodiment of FIG. 1 are indicated by identical reference numerals and therefore will not be described here any further.

When alternating voltage having an appropriate frequency is applied to the torsion actuator B of this embodiment, the end plate 2a will be torsionally vibrated relative to the other end plate 2b. If alternating voltage having a same phase and a same frequency as those of the voltage for the torsion actuator B is applied to the longitudinal displacement elements 18, the rotor 17 will be clamped to the end plate 2a only when it is twisted in one direction and therefore only the rotary force of the torsion actuator B in that direction will be transmitted to the rotor 17. Consequently, the output shaft 15 is kept to rotate only in one direction and hence the motor functions as a stepping motor. In FIG. 4, reference numeral 14 denotes an anchor bolt for rigidly holding the end plate 2b to the bottom plate 11, numeral 17 a rotor, numeral 16 a bearing for the output shaft 15 rigidly connected with the rotor 17 and 12 a top plate for supporting said bearing 16.

With this embodiment, since the rotary angle of the torsion actuator B is proportional to the voltage of the power source and the rotary speed of the torsion inching worm is proportional to the product of the voltage and the frequency of the power source, the rotary speed of the motor can be accurately controlled in a simple manner without any difficulty.

Figure 8:
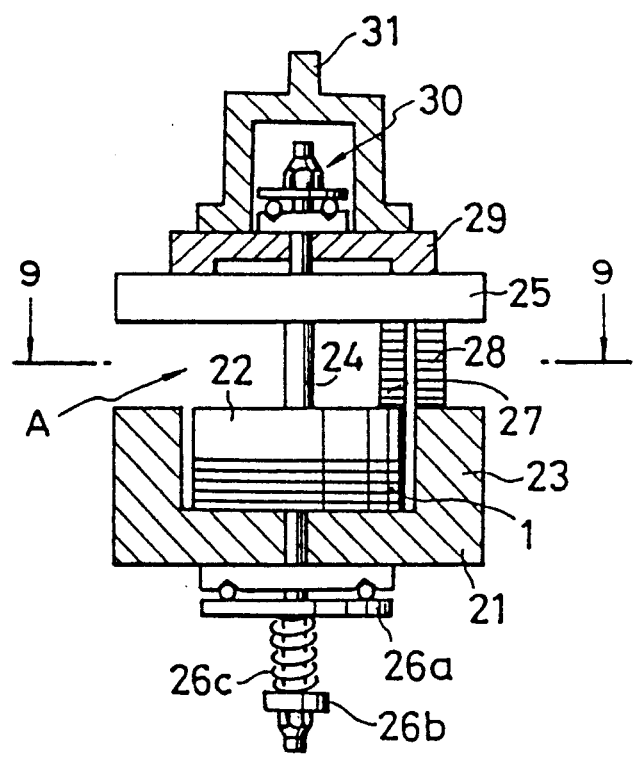
FIG. 8 is a sectional view of the embodiment of FIG. 7 along the 9—9 line.
Figure 9:
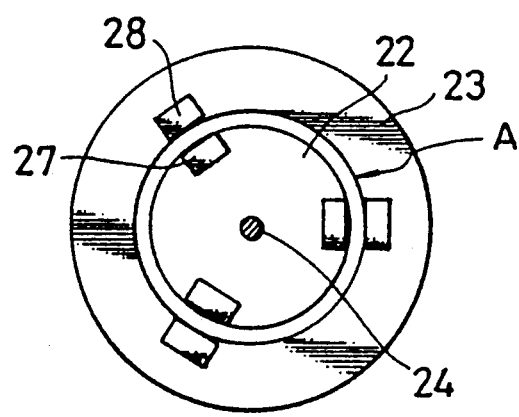
FIG. 9 is a schematic illustration showing the mechanism of rotation of the embodiment of FIG. 7.

FIGS. 8 and 9 of the accompanying drawings illustrate a third embodiment of the invention. While an output shaft is rigidly fitted to a laminate type torsion actuator in each of the preceding embodiments, the present embodiment comprises a separately arranged output shaft.

In this embodiment, a cylindrical wall (fixed member) 23 having a height approximately equal to the height from the lower plate 21 to the top of the upper end plate 22 is integrally formed with the lower end plate 21 of the laminate type torsion actuator A. The center shaft 24 of the laminate type torsion actuator A runs through both of the end plates 21 and 22 and is further extended both above and below the end plates 21 and 22, which are pressed together by an appropriate means (not shown) such as a nut. A disc-shaped rotor (facing member) 25 having a diameter approximately equal to that of said cylindrical wall 23 is fitted to said center shaft 24 and biased downward by an elastic means (coil spring) 26c located between a pair of receiver 26a and 26b fitted respectively under the lower end plate 21 and at the lower end of the center shaft 24. A number of first longitudinally vibrating piezoelectric elements 27 (three in this embodiment) are placed on the upper end plate 22 along its outer periphery and bonded thereto such that they are equally spaced from the adjacent ones and elongated and contracted perpendicularly to the end plate 22. A same number of second longitudinally vibrating piezoelectric elements 28 are placed on the upper edge of the cylindrical wall 23 such that they are respectively juxtaposed with the matching first longitudinally vibrating piezoelectric elements 27 and bonded to the cylindrical wall 23. These longitudinally vibrating piezoelectric elements 27 and 28 are respectively connected with power sources supplying alternating currents with a frequency identical with that of the power source for the laminate type torsion actuator A and phases shifted from each other by 180°. An output shaft 31 is provided on the rotor 25 with a spacer 29 and a connecting member 30 interposed therebetween.

Now operation of the third embodiment will be described by referring to FIGS. 10(a) through (d) which schematically illustrate its function.

Figure 10A:
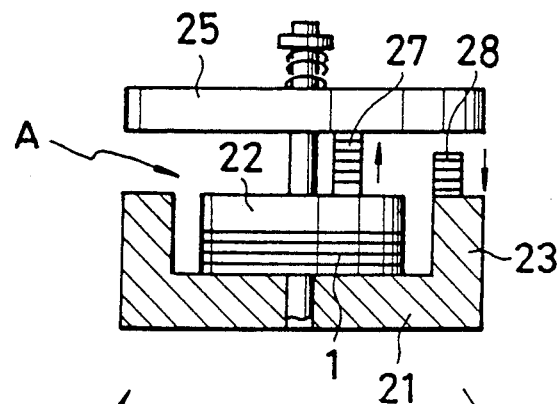
FIG. 10 is a graphic illustration showing the relationship between the drive frequency and the angular speed of rotation.
Figure 10D:
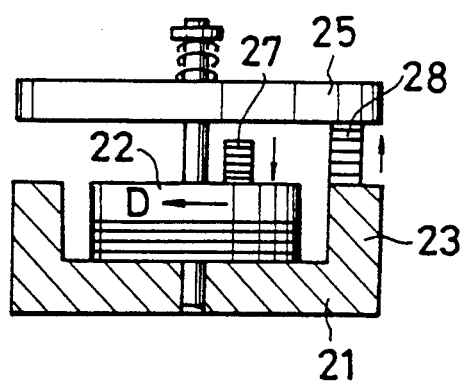
Figure 10B:
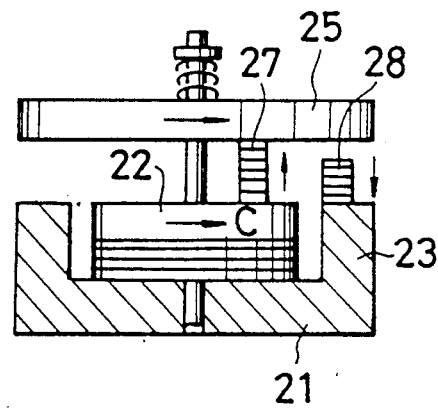
Figure 10C:
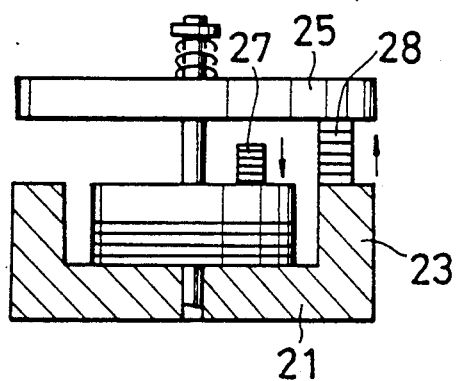

Displacement of the laminate type torsion actuator A in the direction indicated by arrow C (see FIG. 10(b)) is realized in synchronism with elongation of the first longitudinally vibrating elements 27. As they vibrate, the rotor 25 becomes in contact with the end plate 22 and the displacement of the laminate type torsion actuator A is transmitted to it. When the laminate type torsion actuator A is displaced in the direction indicated by arrow D (see FIG. 10(d)), the first longitudinally vibrating elements 27 are contracted, while the second longitudinally vibrating elements 28 are elongated such that the rotor 25 comes in contact with the surrounding wall and hence its displacement is obstructed. Consequently, displacement of the laminate type torsion actuator A is transmitted to the rotor only in one direction with the magnitude of displacement proportional to the number of pulses given by the power source. It would be needless to say that the amplitude of the vibration of the laminate type torsion actuator A is proportional to the voltage of the power source.

Figure 11:
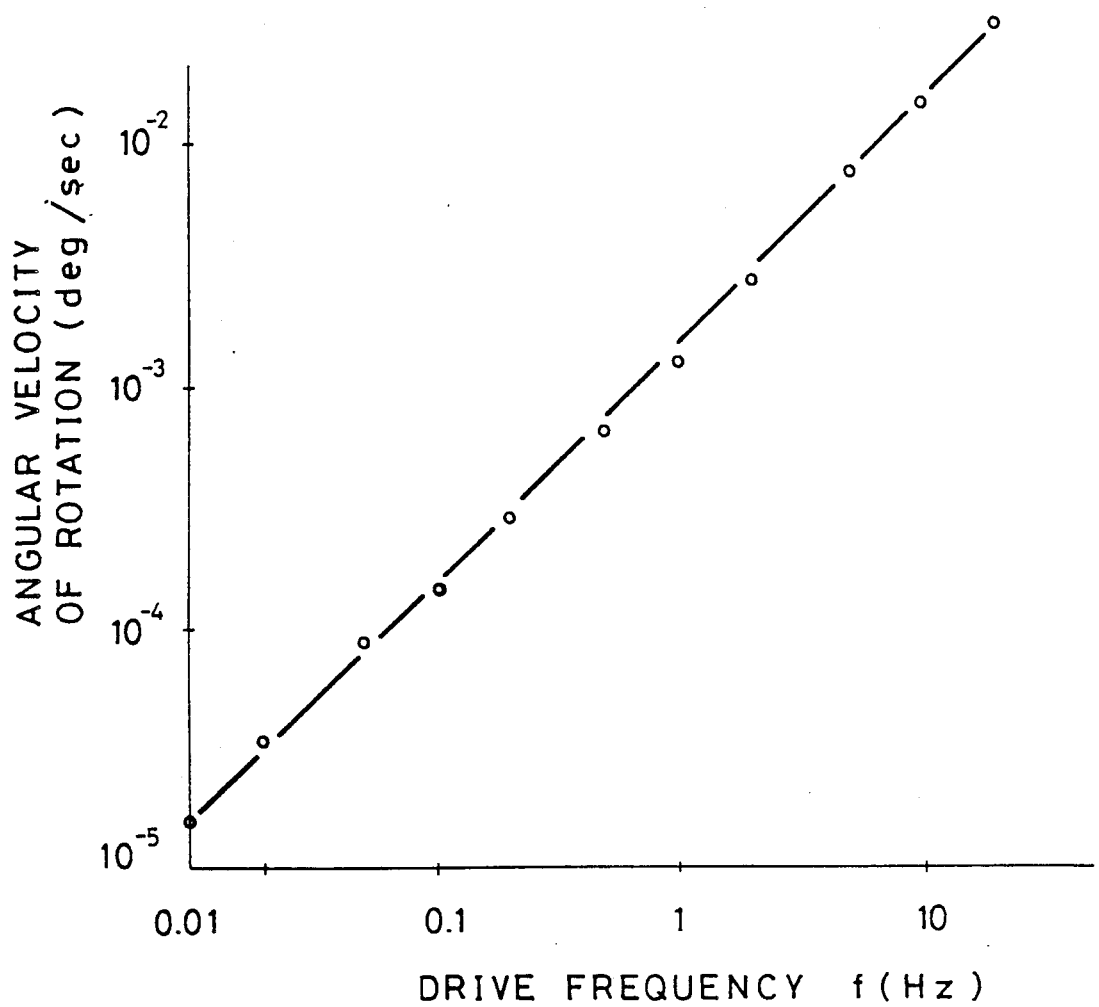
FIG. 11 is a graphic illustration showing the relationship between the voltage applied to a lamainate type torsion actuator and the angular speed of rotation.
Figure 12:
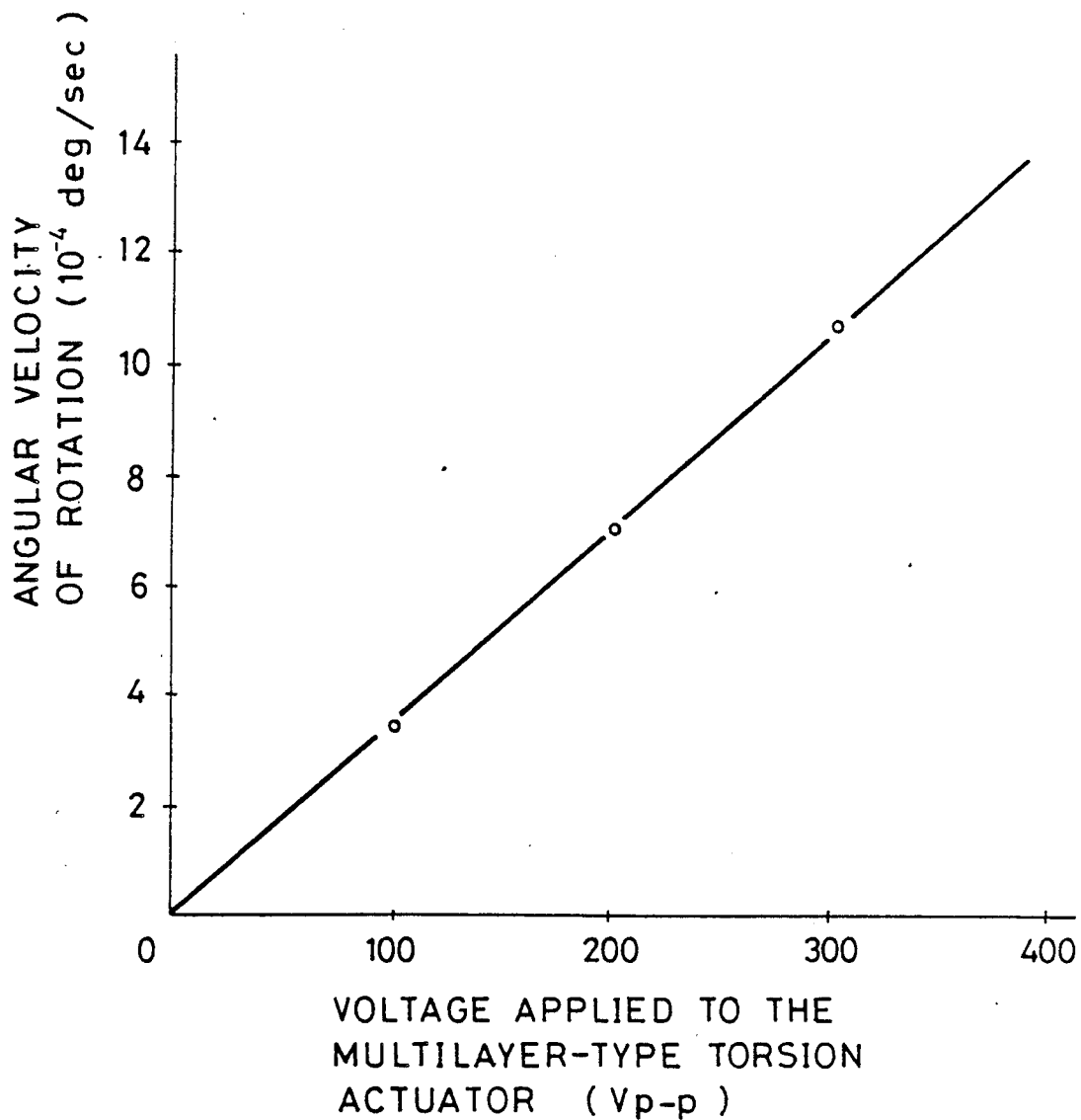
FIG. 12 is a schematic illustration showing a third embodiment of the invention.

In an experiment using this embodiment, an alternating voltage having an amplitude of 70 V and an AC bias voltage of 10 V were applied to the first longitudinally vibrating piezoelectric elements 27, while an alternating voltage having an amplitude of 80 V and an AC bias voltage of 40 V were applied to the second longitudinally vibrating piezoelectric elements 28 and an alternating voltage having an amplitude of 400 V was applied to the laminate type torsion actuator A. The phase of the alternating voltage for the piezoelectric elements 27 was shifted by 180° from that of the alternating voltage for the elements 28, whereas the phase of the alternating voltage for the torsion actuator A was shifted by 90° from those of the alternating voltages for both the first and second piezoelectric elements 27 and 28. The pressure of the coil spring 26c was 64 kgf. FIG. 11 shows the relationship between the frequency of the driving power source and the rotary speed of the motor. FIG. 12 shows how the rotary speed varied in response to the variation of the voltage of the alternating power source for the laminate type torsion actuator when the frequency was 10 Hz.

Since the longitudinally vibrating piezoelectric elements 27 and 28 of this embodiment are not restricted for oscillation unlike those of the first embodiment, the piezoelectric elements 27 and 28 are relatively free from damages due to excessive stress even when the frequency of oscillation is as high the resonance frequency. Therefore, a stepping motor which is configured like this embodiment can produce a high rotary speed when it is driven at a resonance frequency and provides a further advantage of being capable of improving its operating conditions through adjustment of the pressure of the coil spring 26c. More specifically, when the laminate type torsion actuator A is operated under a resonant condition and the frequency of oscillation of the first longitudinally vibrating piezoelectric elements is equal to that of the torsion actuator, the oscillation of the torsion actuator A and that of the first piezoelectric elements 27 are combined to produce elliptical progressive waves on the upper surfaces of said first piezoelectric elements. If the oscillation of the second piezoelectric elements 28 is stopped or they are deformed into a compressed state under this condition, the rotor 25 will be allowed to rotate at a high rate.

Figure 13:
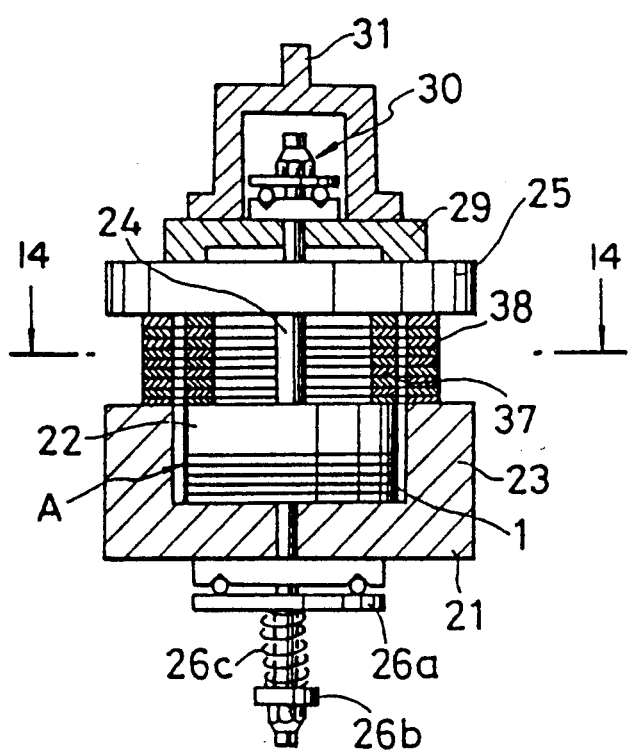
FIG. 13 is a sectional view of the embodiment of FIG. 12 along the 14—14 line.
Figure 14:
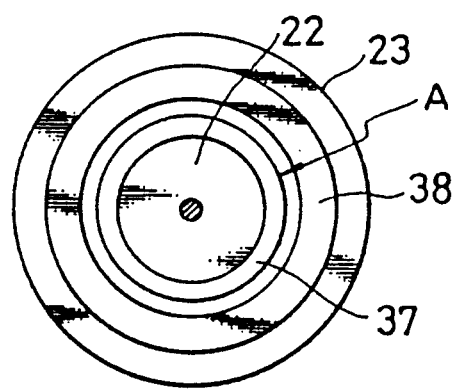
FIG. 14 is a schematic illustration showing a fourth embodiment of the invention.

FIGS. 13 and 14 illustrate a fourth embodiment of the invention. The components which are similar to those of the third embodiment in FIG. 8 are indicated by identical reference numerals and hence will not be described here any further.

This embodiment comprises longitudinally vibrating piezoelectric elements having a configuration different from that of the piezoelectric elements of the third embodiment.

More specifically, this embodiment comprises a first longitudinally vibrating piezoelectric element 37 realized in the form of a cylinder whose outer periphery roughly coincides with that of the upper portion of the laminate type torsion actuator A and a second longitudinally vibrating piezoelectric element 38 also realized in the form of a cylinder whose inner periphery roughly coincides with that of the upper portion of the torsion actuator A.

The longitudinally vibrating piezoelectric elements of such a stepping motor inevitably have an enhanced rigidity which is by far higher than that of their counterparts of the third embodiment such that the torque of the laminate type torsion actuator A will be hardly transmitted to the rotor 25. Consequently, the deflection of the first piezoelectric elements 37 and that of the second piezoelectric elements 38 will be very small relative to the torque load of the torsion actuator.

The rotor 25 of a stepping motor configured as described above can be rotated at a rate same as that of the torsion of the laminate type torsion actuator A because the first and second piezoelectric elements 37 and 38 are deflected only slightly, leading to an improved rotary speed of the rotor 25 and a higher efficiency of the motor.

Such cylindrical longitudinally vibrating piezoelectric elements as used in this embodiment may be safely applied to the second embodiment described earlier.

Figure 15:
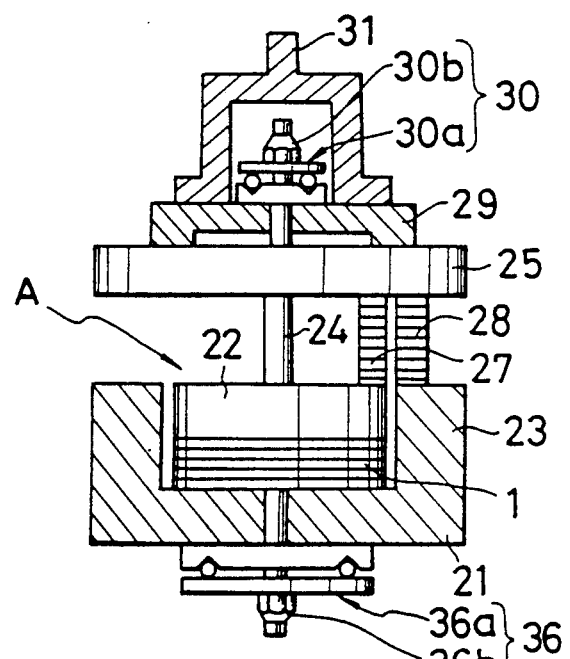
FIG. 15 is a schematic illustration showing a fifth embodiment of the invention.

FIG. 15 illustrates a fifth embodiment of the invention. Those components of this embodiment which are similar to their counterparts in the third embodiment will be indicated by identical reference numerals and hence will not be described any further.

This embodiment has a structural feature for the connecting section at the lower end of the center shaft 24 that makes it remarkably different from the preceding embodiments.

The lower end of the center shaft (connecting body) 24 is connected with the lower surface of an end plate 21 by way of a second connecting member 36. Said connecting member 36 is designed to bear the tensile load of the center shaft 24 and comprises a threaded thrust bearing 36a engaged with the lower end portion of the center shaft 24 for rotatably supporting the shaft 24 and a fixed nut 36b also engaged with the lower end portion of the center shaft 24 for transmitting the tensile load of the center shaft 24 to the thrust bearing 36a. A first connecting member 30 is designed to connect the upper end portion of the center shaft 24 to the upper surface of a spacer 29 and comprises a thrust bearing 30a for receiving the tensile load of the center shaft 24 and rotatably supporting it and a fixed nut 30b engaged with the upper end portion of the center shaft 24 for transmitting the tensile load of the shaft 24 to the thrust bearing 36a.

With a stepping motor having a configuration as described above, the distance between the lower surface of the rotor 25 and the upper surface of the end plate 22 as well as the distance between the lower surface of the rotor 25 and the upper edge of the surrounding wall 23 can be correctly adjusted by moving the positions of engagement of the fixed nuts 30b and 36b.

Therefore, with such an arrangement, because of the adjustability of the distance between the lower surface of the rotor 25 and the upper surface of the end plate 22 as well as the distance between the lower surface of the rotor 25 and the upper edge of the surrounding wall 23, the longitudinally vibrating piezoelectric elements 27, 28 are selectively connected with or separated from the lower surface of the rotor 25 in such a manner that the piezoelectric element 27 or 28 pushes the rotor with an even and constant force. It should be noted that, in the preceding embodiments, if a spring is used to elastically push the rotor 25 against the longitudinally vibrating piezoelectric elements 27 and 28, the oscillation of the spring can not catch up with the oscillation of the longitudinally vibrating piezoelectric elements 27, 28 when the frequency is high and hence the apparent pushing force of the spring will be reduced, entailing a significant reduction of torque. The present embodiment is not accompanied by such a problem.

It may be needless to mention that a connecting member 36 may also be applied to the third and fourth embodiments of the invention.

Figure 16:
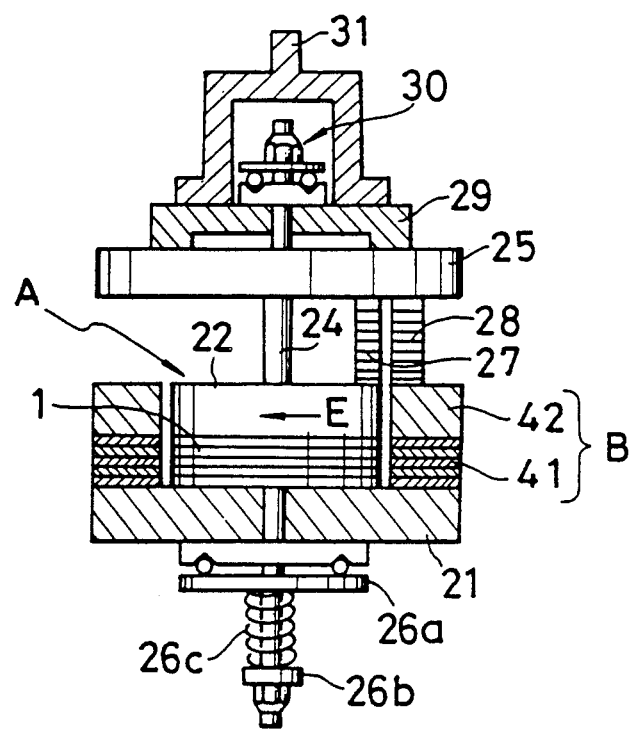
FIGS. 16 and 17 are perspective views illustrating a conventional laminate type torsion actuator.
Figure 17:
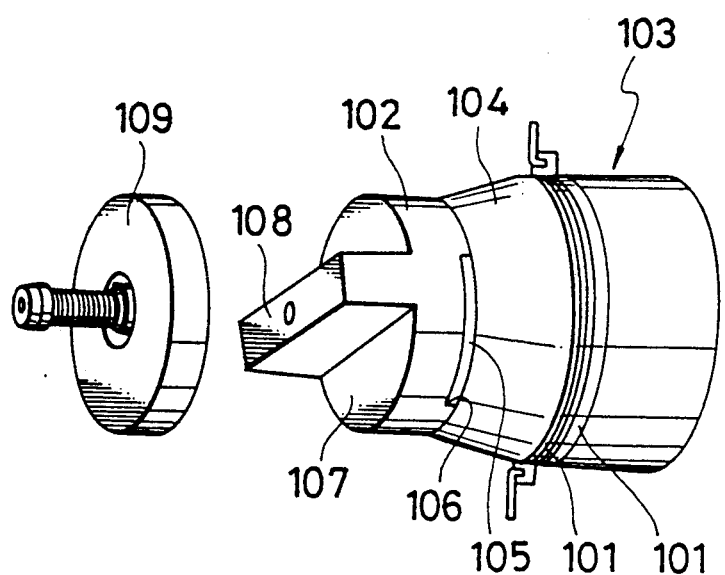
Figure 18:
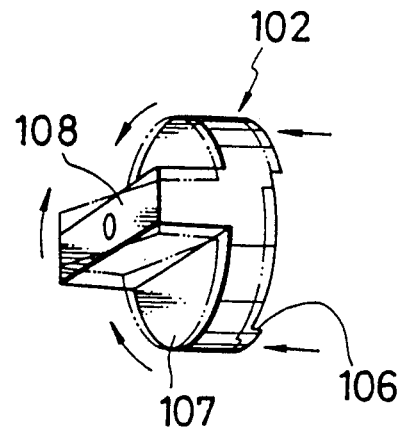

FIG. 16 illustrates a sixth embodiment of the invention. The components which are similar to those of the third embodiment illustrated in FIG. 8 are indicated by identical reference numerals and hence any further explanation thereof is omitted here.

This embodiment differs from the second embodiment only in terms of the structure of the surrounding wall (fixed member).

The surrounding wall of this embodiment is realized as a second laminate type torsion actuator B comprising a cylindrical laminate piezoelectric body 41 and a cylindrical ring body 42 made of aluminium and connected coaxially with the upper edge of the laminate piezoelectric body 41, the upper edge of the ring body 42 being located at a level same as that of the upper surface of an end plate 22.

For a stepping motor having a configuration as described above, an alternating voltage with a phase shifted by 180° from that of the alternating voltage for the first laminate type torsion actuator A will be applied to the second laminate type torsion actuator B. It should be noted that voltage is applied to the longitudinally vibrating piezoelectric elements 27 and 28 for elongation when the laminate type torsion acutators A and B are twisted in the direction of arrow E, whereas voltage is applied to the piezoelectric elements 27 and 28 for contraction when the torsion actuators A and B are twisted in the direction opposite to that of arrow E. Then, the first longitudinally vibrating piezoelectric elements 27 are elongated to get in touch with the laminate type torsion actuator A when it is twisted in the direction of arrow E, while the second laminate type torsion actuator B is twisted in the direction opposite to that of arrow E as the second longitudinally vibrating piezoelectric elements 28 are contracted and consequently separated from the rotor 25. On the contrary, when the laminate type torsion actuator A is twisted in the direction opposite to that of arrow E, the first longitudinally vibrating piezoelectric elements 27 are contracted and consequently separated from the rotor 25, while the second torsion actuator B is twisted in the direction of arrow E as the second piezoelectric elements 28 are elongated and connected with the rotor 25. As a result, the rotor 25 is rotated by the laminate type torsion actuators A and B which are alternately twisted in the direction of arrow E.

Therefore, the rate of rotation of the rotor 25 of a stepping motor configured as described above can be increased to approximately twice as great as that of a stepping motor having only one laminate type torsion actuator.

It may be needless to say that the surrounding wall 23 of the third embodiment as well as that of the fourth embodiment and that of the fifth embodiments can be replaced by a laminate type torsion actuator similar to the torsion actuator B of this embodiment.

EFFECTS OF THE INVENTION

According to the invention, there is provided a stepping motor comprising a laminate type torsion actuator having a pair of cylindrical outer peripheries to be torsionally displaced relative to each other, a cylindrical fixed member surrounding said laminate type torsion actuator with certain space therebetween, first longitudinally vibrating elements placed between said fixed member and one of the cylindrical outer peripheries of said laminate type torsion actuator for selectively connecting or separating the fixed member and the torsion actuator through its elongation or contraction, second longitudinally vibrating elements placed between said fixed member and the other cylindrical peripheries of said torsion actuator with certain space therebetween for selectively connecting or separating the fixed member and the torsion actuator through its elongation or contraction with a phase inverse to that of the first elements. Such a stepping motor allows fine control of its rotary speed and position and large torque.

A preferable embodiment of the invention comprises a laminate type torsion actuator, a facing member juxtaposed with said actuator, said actuator and said facing member being relatively rotatable, and a longitudinally displacing element placed between the surface of an axial end portion of said torsion actuator and said facing member for moving said facing member close to or away from said torsion actuator through its expansion or contraction. Such a stepping motor allows fine control of rotary speed through adjustment of both the voltage and the frequency of the power source and therefore can be suitably used as a motor for a high precision machine that requires fine control of motion.

Another preferable embodiment of the invention comprises a laminate type torsion actuator, a facing member juxtaposed with said actuator, said torsion actuator and said facing member being rotatable relative to each other, a first longitudinal vibrator located between said laminate type torsion actuator and said facing member for moving said facing member close to or away from said torsion actuator through its contraction or expansion and a second longitudinal vibrator provided between said facing member and a fixed member juxtaposed with said facing member for moving said facing member close to or away from said fixed member through its oscillation with a phase inverse to that of oscillation of said first longitudinal vibrator. Such a stepping motor also allows fine control of rotary speed and large torque.

Still another preferable embodiment of the invention comprises a first longitudinal vibrator and a second longitudinal vibrator realized in the form of so many cylinders. Such longitudinal vibrators have an enhanced rigidity and hence allows the stepping motor to have a high rotary speed to achieve an improved efficiency.

Still another embodiment of the invention further comprises a connector for controlling the distance between the actuator and the facing member. Such an arrangement allows the longitudinal vibrators to be pressed against the facing member and the laminate type torsion actuator with an even force over a wide range of the frequency of the power source from low to high, eliminating any possibility for the torque to be reduced when the frequency becomes high.

Still further embodiment of the invention comprises a fixed member constituted by a second laminate type torsion actuator to be torsionally oscillated with a phase inverse to that of the first laminate type torsion actuator. With such an arrangement of a stepping motor, the second laminate type torsion actuator will be twisted in the direction opposite to the direction of torsion of the first torsion actuator, allowing the facing member to be rotated by the torsion of not only the first torsion actuator but also the second torsion actuator and hence at a speed twice as high as a motor having no second torsion actuator.

Still further embodiment of the invention is characterized by that a first laminate type torsion actuator and a longitudinal vibrator are oscillated with a frequency equal to the resonance frequency of the laminate type torsion actuator. Such a stepping motor can be operated in an energy-saving manner at a very high rotary speed.

While a number of embodiments of the stepping motor according to the invention have been described in terms of a laminate type torsion actuator, a torsion inch worm that also utilizes the thickness slide effect of a piezoelectric body to obtain rotary force may also be used as a motor whose rotary speed can be finely controlled by adjusting both the voltage and the frequency of the power source. Such an inch worm is particularly effective as a motor of a precision machine and therefore falls within the scope of the present invention.

What is claimed is:

1. A stepping motor comprising a laminate type torsion actuator having a pair of cylindrical outer peripheries to be torsionally displaced relative to each other, a cylindrical fixed member surrounding said laminate type torsion actuator with certain space therebetween, first longitudinally vibrating elements placed between said fixed member and one of the cylindrical outer peripheries of said laminate type torsion actuator for selectively connecting or separating the fixed member and the torsion actuator through its elongation or contraction, second longitudinally vibrating elements placed between said fixed member and the other cylindrical peripheries of said torsion actuator with certain space therebetween for selectively connecting or separating the fixed member and the torsion actuator through its elongation or contraction with a phase inverse to that of the first elements.

2. A stepping motor comprising a laminate type torsion actuator, a facing member juxtaposed with said actuator, said torsion actuator and said facing member being rotatable relative to each other, a first longitudinal vibrator located between said laminate type torsion actuator and said facing member for moving said facing member close to or away from said torsion actuator through its contraction or expansion and a second longitudinal vibrator provided between said facing member and a fixed member juxtaposed with said facing member for moving said facing member close to or away from said fixed member through its oscillation with a phase inverse to that of oscillation of said first longitudinal vibrator.

3. A stepping motor according to claim 2, wherein either one or both of the first longitudinal vibrator and the second longitudinal vibrator are realized in the form of a cylinder coaxially surrounding the laminate type torsion actuator.

4. A stepping motor according to claim 2, wherein said laminate type torsion actuator and said facing member are relatively rotatably connected by a connector for controlling the distance between the laminate type torsion actuator and the facing member.

5. A stepping motor according to claim 2, wherein said fixed member is constituted by a second laminate type torsion actuator to be torsionally oscillated with a phase inverse to that first laminate type torsion actuator.

6. A method driving the stepping motor according to claim 2 comprising the step of:
oscillating said laminate type torsion actuator and said first longitudinal vibrator with a frequency equal to the resonance frequency of said laminate type torsion actuator, while maintaining said second longitudinal vibrator in a halted condition, wherein said laminate type torsion actuator is separated from said facing member in said halted condition.

* * * * *